(12) United States Patent
Ishibashi (10) Patent No.: US 10,892,173 B2
(45) Date of Patent: Jan. 12, 2021

(54) SUBSTRATE CLEANING ROLL, SUBSTRATE CLEANING APPARATUS, AND SUBSTRATE CLEANING METHOD

(71) Applicant: Ebara Corporation, Tokyo (JP)

(72) Inventor: Tomoatsu Ishibashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 277 days.

(21) Appl. No.: 15/522,596

(22) PCT Filed: Oct. 20, 2015

(86) PCT No.: PCT/JP2015/005280
§ 371 (c)(1),
(2) Date: Apr. 27, 2017

(87) PCT Pub. No.: WO2016/067563
PCT Pub. Date: May 6, 2016

(65) Prior Publication Data
US 2017/0316959 A1    Nov. 2, 2017

(30) Foreign Application Priority Data

Oct. 31, 2014  (JP) .................................. 2014-223728

(51) Int. Cl.
*H01L 21/67*   (2006.01)
*B08B 1/00*   (2006.01)
(Continued)

(52) U.S. Cl.
CPC ........ *H01L 21/67046* (2013.01); *B08B 1/001* (2013.01); *B08B 1/04* (2013.01);
(Continued)

(58) Field of Classification Search
None
See application file for complete search history.

(56) References Cited

U.S. PATENT DOCUMENTS 6,299,698 B1 * 10/2001 Emami .................... B08B 1/04
134/6
2010/0043160 A1 * 2/2010 Chen ................. H01L 21/67046
15/102

(Continued)

FOREIGN PATENT DOCUMENTS

CN   102792424 A   11/2012
EP   0 937 509 A1   8/1999
(Continued)

OTHER PUBLICATIONS

Japan Patent Office, International Search Report in International Application No. PCT/JP2015/005280 (dated Dec. 7, 2015).

(Continued)

*Primary Examiner* — Nicole Blan
(74) *Attorney, Agent, or Firm* — Leydig, Voit & Mayer, Ltd.

(57) ABSTRACT

A substrate cleaning roll that has a cylindrical shape and scrubs a surface of a substrate by rotating about a rotational axis in a longitudinal direction in contact with the substrate, the longitudinal direction being parallel to the surface of the substrate, the substrate cleaning roll including a bevel cleaner at least at one end of the substrate cleaning roll in the longitudinal direction, the bevel cleaner including a sloping surface to be in contact with an outermost edge of a bevel portion at a rim of the substrate when the substrate cleaning roll comes into contact with the substrate and cleans the surface of the substrate.

6 Claims, 6 Drawing Sheets

(51) Int. Cl.
*B08B 1/04* (2006.01)
*B08B 3/08* (2006.01)
*H01L 21/02* (2006.01)

(52) U.S. Cl.
CPC .......... *B08B 3/08* (2013.01); *H01L 21/02087* (2013.01); *H01L 21/02065* (2013.01); *H01L 21/02074* (2013.01)

(56) References Cited

U.S. PATENT DOCUMENTS

2012/0312323 A1* 12/2012 Ishibashi .......... H01L 21/67046
134/6
2013/0048018 A1 2/2013 Wargo et al.

FOREIGN PATENT DOCUMENTS

| | | |
|---|---|---|
| JP | H11-283952 A | 10/1999 |
| JP | 2002-313767 A | 10/2002 |
| JP | 2003-163196 A | 6/2003 |
| JP | 2008/142590 A | 6/2008 |
| JP | 2013-520803 A | 6/2013 |
| WO | WO 1998/020987 A1 | 5/1998 |

OTHER PUBLICATIONS

The State Intellectual Property Office of People's Republic of China, The First Office Action in Chinese Patent Application No. 201580058746.0 (dated Aug. 16, 2019).

* cited by examiner

PRIOR ART

FIG.6

PRIOR ART

SUBSTRATE CLEANING ROLL, SUBSTRATE CLEANING APPARATUS, AND SUBSTRATE CLEANING METHOD

CROSS-REFERENCE TO RELATED APPLICATIONS

This patent application is the U.S. national phase of International Patent Application No. PCT/JP2015/005280, filed Oct. 20, 2015, which claims the benefit of priority from Japanese Patent Application No. 2014-223728, filed on Oct. 31, 2014, the entire contents of which are incorporated herein by reference.

TECHNICAL FIELD

The present technology relates to a substrate cleaning roll for scrubbing substrate surfaces, and to a substrate cleaning apparatus and a substrate cleaning method for cleaning substrates with the substrate cleaning roll.

BACKGROUND ART

As semiconductor devices have become smaller in size, substrates having microstructures (substrates on which material films whose physical properties vary are formed) are being processed these days. For example, in a damascene interconnect formation process in which wiring grooves formed in a substrate are filled with metal, extra metal is removed by polishing performed by a substrate polishing system (CMP system) after the damascene interconnect formation, and thus, material films (such as a metal film, a barrier film, and an insulating film) that vary in physical properties are formed on the substrate surface. On such a substrate surface, there are residues of the slurry used in CMP and metal grinding sludge (such as Cu grinding sludge). Therefore, in a case where a substrate surface cannot be sufficiently cleaned, such as a case where complexity of a substrate surface makes the cleaning difficult, leakage or an adhesion defect occurs due to residues or the like, and might result in a decrease in reliability. To counter this, a CMP system that polishes semiconductor substrates conducts cleaning after the polishing.

Known substrate cleaning methods include roll cleaning for scrubbing a substrate surface by rotating a member (a substrate cleaning roll) such as a cylindrical sponge about an axis parallel to the substrate surface, as well as pencil cleaning for scrubbing a substrate surface by rotating a member such as a sponge about an axis perpendicular to the substrate surface, and two-fluid cleaning in which a fluid and a gas are mixed and are then sprayed onto a substrate surface.

A large number of small cylindrical projections (nodules) are formed on the surface of such a substrate cleaning roll. As the substrate cleaning roll rotates about an axis parallel to the substrate surface, the nodules sequentially scrub the substrate surface and thus clean the substrate surface (see Patent Literature 1, for example).

Figure 4A:
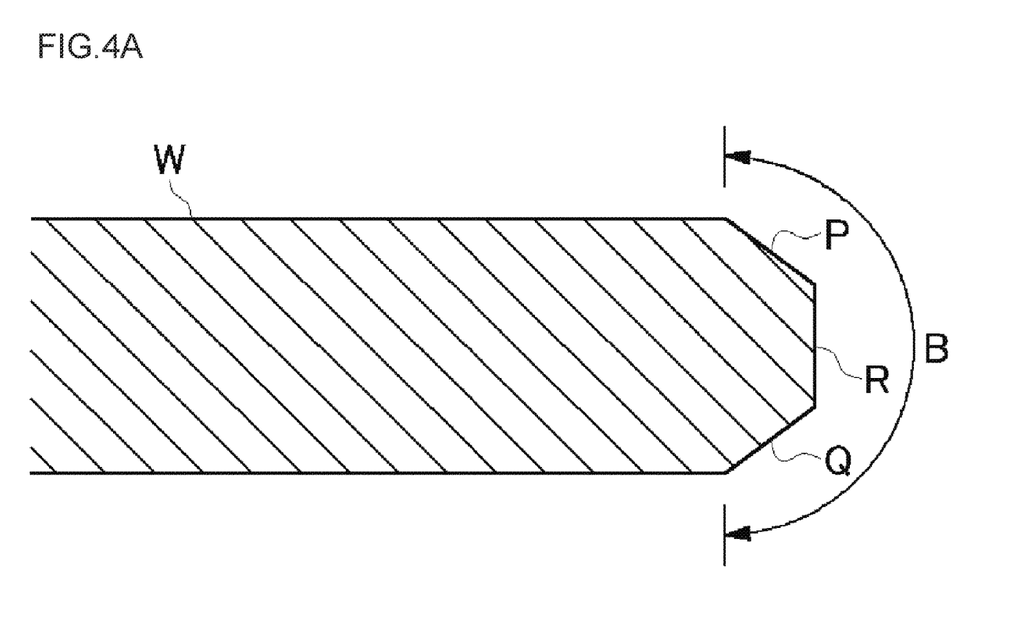
FIG. 4A is a cross-sectional view of a straight-type bevel portion of a substrate.
Figure 4B:
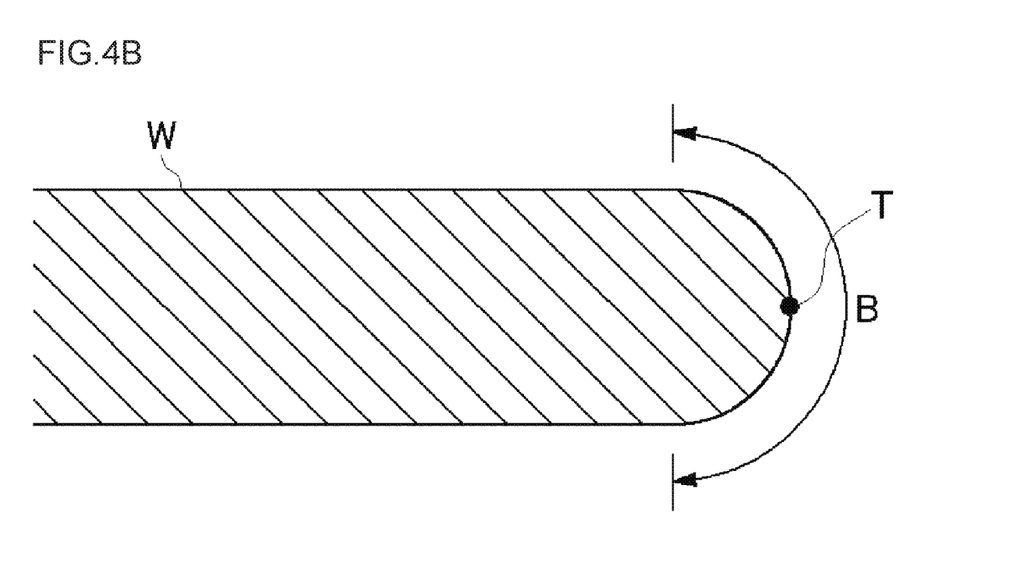
FIG. 4B is a cross-sectional view of a round-type bevel portion of a substrate.

The substrate to be cleaned has a disk-like shape, and, at the rim of the substrate, has the bevel portion protruding outward and having a smaller thickness at a portion closer to the edge. FIG. 4A is a cross-sectional view of a straight-type bevel portion of a substrate. FIG. 4B is a cross-sectional view of a round-type bevel portion of a substrate. In the substrate S shown in FIG. 4A, the bevel portion B is formed with an upper sloping portion (an upper bevel portion) P, a lower sloping portion (a lower bevel portion) Q, and a side portion (an apex) R. In the example in FIG. 4A, the side portion R is the outermost edge of the substrate S, and therefore, the outermost edge is a face (while being a line in cross-section). In the substrate S shown in FIG. 4B, the bevel portion B is a portion that has a cross-sectional shape that is curved and protrudes outward. In the example in FIG. 4B, the point T in the bevel portion B at the center in the thickness direction of the substrate S is the outermost edge, and therefore, the outermost edge is a line (while being a point in cross-section).

A substrate cleaning roll is a roller having a rotational axis parallel to substrate surfaces. Therefore, a substrate cleaning roll cannot scrub the bevel portion of a substrate S, leaving particles on the bevel portion. To counter this, a conventional roll cleaning apparatus includes a side roller having a rotational axis perpendicular to substrate surfaces, in addition to substrate cleaning rolls. The side portion of a substrate is scrubbed by the side roller, and the ends of the substrate cleaning rolls each have a shape modified to clean the bevel portion (see Patent Literature 2, for example).

Figure 5:
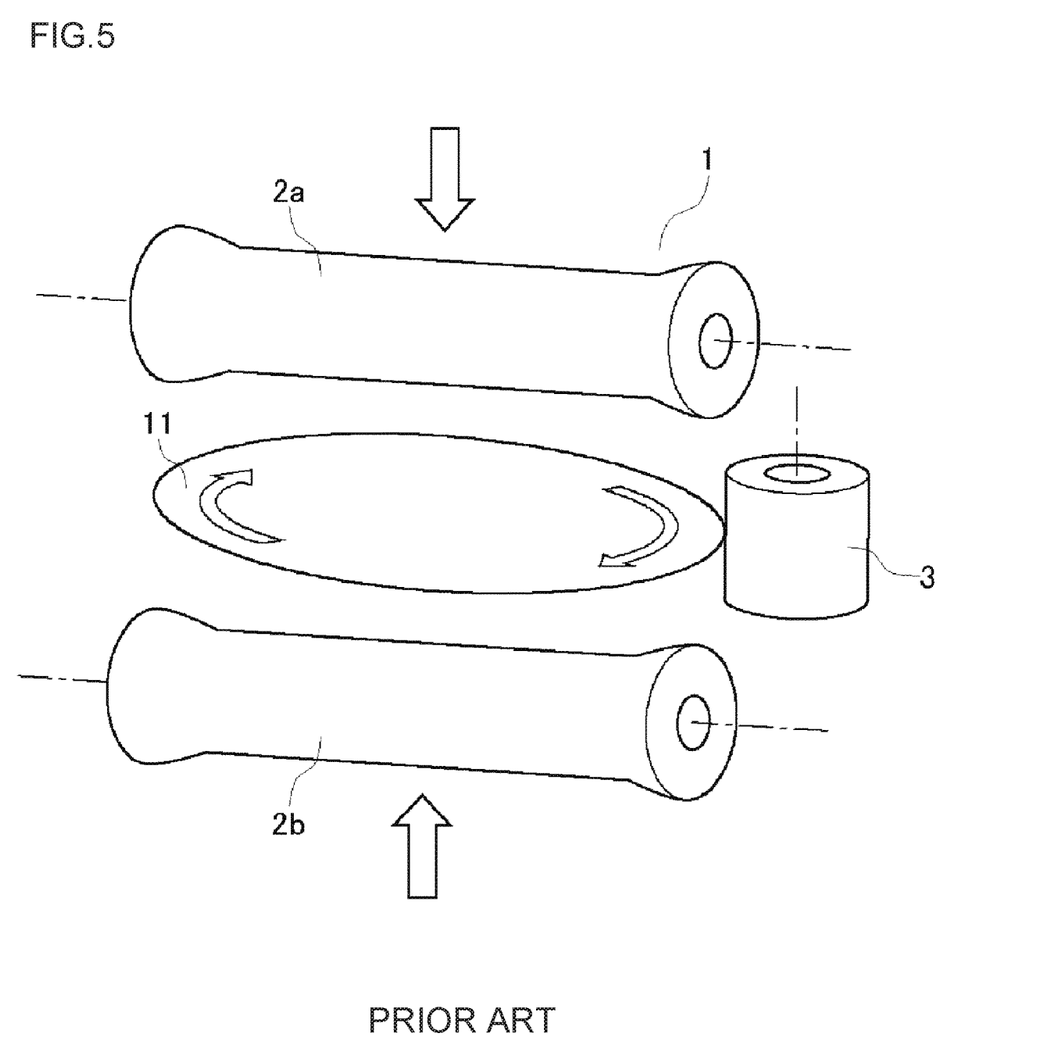
FIG. 5 is a diagram showing the entire structure of a conventional substrate cleaning apparatus.
Figure 6:
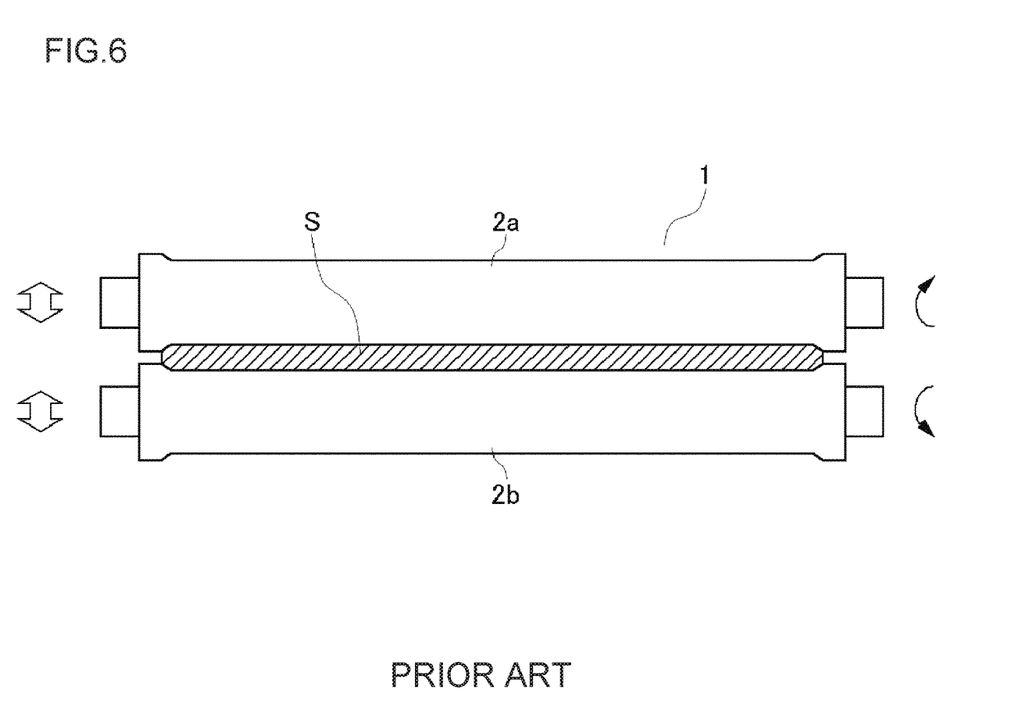
FIG. 6 is a side view of the substrate cleaning rolls of the conventional substrate cleaning apparatus and a substrate.

FIG. 5 is a diagram showing the entire structure of a substrate cleaning apparatus according to Patent Literature 2. FIG. 6 is a side view of the substrate cleaning rolls of the substrate cleaning apparatus according to Patent Literature 2, and a substrate. In this substrate cleaning apparatus 1, a pair of substrate cleaning rolls 2*a* and 2*b* are disposed above and below a substrate S, and can be brought into contact with and be detached from the upper surface (the front surface) and the lower surface (the back surface) of the substrate S. Both ends of each of the substrate cleaning rolls 2*a* and 2*b* are slightly larger than the other portions. Thus, both ends of each of the substrate cleaning rolls 2*a* and 2*b* scrub the bevel portion of the substrate S and clean the bevel portion as the substrate cleaning rolls 2*a* and 2*b* roll along the bevel portion, as shown in FIG. 6.

The substrate cleaning apparatus 1 also includes a side roller 3 provided in a position that does not interfere with the substrate cleaning rolls 2*a* and 2*b*. The side roller 3 has a cylindrical shape, and scrubs and cleans the outermost edge of the substrate S the ends of the substrate cleaning rolls 2*a* and 2*b* cannot reach. The bevel portion of the substrate S can be cleaned with the substrate cleaning rolls 2*a* and 2*b*, and the side roller 3.

CITATION LIST

Patent Literatures

Patent Literature 1: WO 98/020987 A
Patent Literature 2: JP 2003-163196 A

SUMMARY OF INVENTION

Technical Problem

In the substrate cleaning apparatus 1 according to Patent Literature 2, however, the substrate cleaning rolls 2*a* and 2*b* are not enough to clean the entire bevel portion including the outermost edge of the substrate S, and therefore, the side roller 3 is required separately from the substrate cleaning rolls 2*a* and 2*b*. This is because the substrate cleaning rolls 2*a* and 2*b* cannot clean the outermost edge of the substrate S.

The present technology has been made in view of the above problem, and aims to provide a substrate cleaning roll capable of cleaning the outermost edge of a substrate, and a substrate cleaning apparatus and a substrate cleaning method that use the substrate cleaning roll.

Solution to Problem

A substrate cleaning roll according to one embodiment has a cylindrical shape and scrubs a surface of a substrate by rotating about a rotational axis in a longitudinal direction in contact with the substrate, the longitudinal direction being parallel to the surface of the substrate, the substrate cleaning roll comprising a bevel cleaner at least at one end of the substrate cleaning roll in the longitudinal direction, the bevel cleaner comprising a sloping surface to be in contact with an outermost edge of a bevel portion at a rim of the substrate when the substrate cleaning roll comes into contact with the substrate and cleans the surface of the substrate.

In this structure, the outermost edge of the bevel portion at the rim of the substrate is cleaned by the bevel cleaner of the substrate cleaning roll.

The bevel cleaner may have a trapezoidal shape including a contact surface in a cross-section taken along a virtual plane including the rotational axis.

In this structure, the bevel cleaner can be easily deformed so as to enclose the bevel portion at the rim of the substrate.

A plurality of nodules may be formed on the substrate cleaning roll, the plurality of nodules being configured to be in contact with the surface of the substrate at a time of cleaning of the surface of the substrate; and a height of the bevel cleaner may be greater than a height of the nodules.

In this structure, the bevel cleaner can also be easily deformed so as to enclose the bevel portion at the rim of the substrate.

A skin layer may be removed from the sloping surface.

In this structure, the bevel cleaner can also be easily deformed so as to enclose the bevel portion at the rim of the substrate.

A substrate cleaning apparatus according to one embodiment comprises a substrate holding member configured to hold a substrate; a substrate cleaning roll configured to scrub a surface of the substrate by rotating about a rotational axis in a longitudinal direction in contact with the substrate, the longitudinal direction being parallel to the surface of the substrate, the substrate cleaning roll having a cylindrical shape; a vertical drive mechanism configured to push the substrate cleaning roll against the surface of the substrate held by the substrate holding member, the longitudinal direction being parallel to the surface of the substrate; and a rotative drive mechanism configured to rotate the substrate cleaning roll about the rotational axis in the longitudinal direction, the substrate cleaning roll being pushed against the surface of the substrate by the vertical drive mechanism, wherein the substrate cleaning roll comprises a bevel cleaner at least at one end of the substrate cleaning roll in the longitudinal direction, the bevel cleaner comprising a sloping surface to be in contact with an outermost edge of a bevel portion at a rim of the substrate when the substrate cleaning roll is brought into contact with the substrate by the vertical drive mechanism.

In this structure, the outermost edge of the bevel portion at the rim of the substrate is also cleaned by the bevel cleaner of the substrate cleaning roll.

The bevel portion at the rim of the substrate may comprise two sloping portions and a side portion between the two sloping portions; and, when the vertical drive mechanism may push the substrate cleaning roll against the substrate held by the substrate holding member, the sloping surface may be deformed and comes into contact with one of the sloping portions and the side portion of the substrate.

If the bevel portion of the substrate is of a straight type in this structure, the side portion of the bevel portion can also be cleaned with the substrate cleaning roll.

The bevel portion at the rim of the substrate may comprise a curved cross-section protruding outward; and, when the vertical drive mechanism may push the substrate cleaning roll against the substrate held by the substrate holding member, the sloping surface may be deformed and comes into contact with a portion between the surface of the substrate and the outermost edge of the bevel portion.

If the bevel portion of the substrate is of a round type in this structure, the outermost edge of the bevel portion can also be cleaned with the substrate cleaning roll.

The substrate cleaning apparatus may comprises two of the substrate cleaning rolls as two substrate cleaning rolls configured to clean two surfaces of the substrate.

In this structure, the bevel cleaner of one of the two substrate cleaning rolls is in contact with any desired spots on the bevel portion at the rim of the substrate, and thus, the bevel portion can be thoroughly scrubbed.

A substrate cleaning method according to one embodiment comprises: supporting and rotating a substrate; rotating a substrate cleaning roll about a rotational axis in a longitudinal direction of the substrate cleaning roll, the substrate cleaning roll having a cylindrical shape; and bringing the rotating substrate cleaning roll into contact with the rotating substrate, with the longitudinal direction being parallel to a surface of the substrate, to scrubbing a surface of the substrate, wherein, when the substrate cleaning roll comes into contact with the substrate, a sloping surface of a bevel cleaner of the substrate cleaning roll comes into contact with an outermost edge of a bevel portion at a rim of the substrate and cleans the outermost edge, the bevel cleaner being formed at least at one end of the substrate cleaning roll in the longitudinal direction.

In this structure, the outermost edge of the bevel portion at the rim of the substrate is also cleaned by the bevel cleaner of the substrate cleaning roll.

DESCRIPTION OF EMBODIMENTS

The following is a description of a substrate cleaning roll and a substrate cleaning apparatus according to an embodiment of the present technology, with reference to the drawings. It should be noted that the embodiment described below is an example case where the present technology is embodied, and does not limit the present technology to the specific structures described below. In embodying the present technology, any appropriate specific structure according to an embodiment may be employed.

Figure 1:
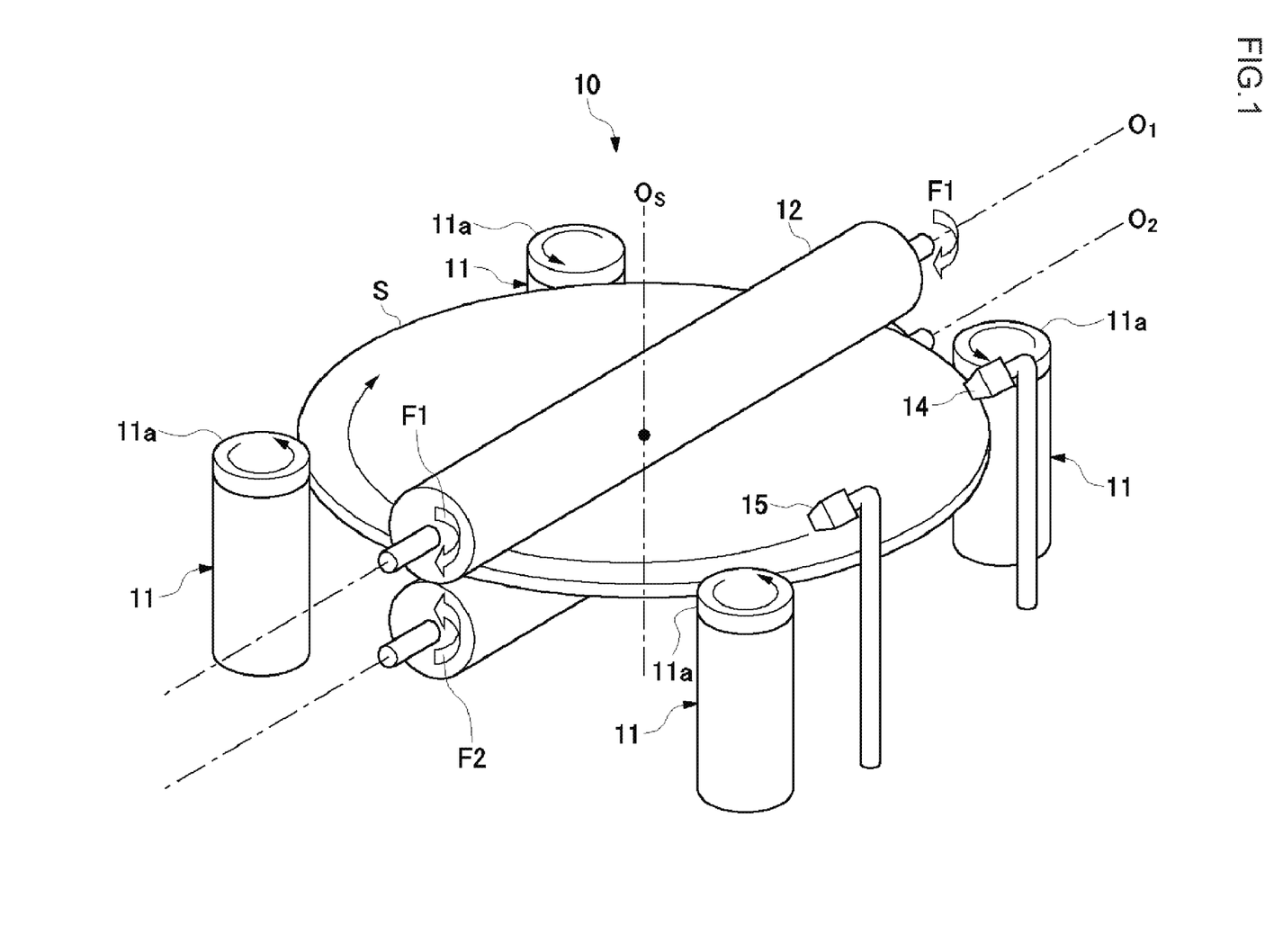
FIG. 1 is a perspective view of the outline of a cleaning apparatus according to an embodiment of the present technology.

FIG. 1 is a perspective view of the outline of a substrate cleaning apparatus according to an embodiment of the present technology. As shown in FIG. 1, a substrate cleaning apparatus 10 includes: multiple (four in FIG. 1) spindles 11 (the substrate holding members) as a substrate rotating mechanism that supports a substrate S at the rim while maintaining the surfaces in a horizontal position, horizontally rotates the substrate S, and is capable of moving in a horizontal direction; an upper substrate cleaning roll (a roll sponge) 12 rotatably supported by a roll holder that is not shown in the drawing; and a lower substrate cleaning roll (a roll sponge) 13 rotatably supported by a roll holder that is not shown in the drawing. The upper substrate cleaning roll 12 and the lower substrate cleaning roll 13 each have a cylindrical shape and extend in an elongated fashion. It should be noted that the upper substrate cleaning roll 12 can be moved up and down relative to the upper surface (the front surface) of the substrate S by the roll holder, and the lower substrate cleaning roll 13 can be moved up and down relative to the lower surface (the back surface) of the substrate S by the roll holder.

The upper substrate cleaning roll 12 is rotated, as indicated by an arrow F1, by a drive mechanism (a rotary drive means) that is not shown in the drawing. The lower substrate cleaning roll 13 is rotated, as indicated by an arrow F2, by a drive mechanism that is not shown in the drawing. Two cleaning solution supply nozzles 14 and 15 that supply cleaning solutions to the surfaces of the substrate S are disposed above the substrate S that is supported by the spindles 11 and is rotated. The cleaning solution supply nozzle 14 is a nozzle that supplies a rinse solution (ultrapure water, for example) to the surfaces of the substrate S, and the cleaning solution supply nozzle 15 is a nozzle that supplies a chemical cleaning solution to the surfaces of the substrate S.

The substrate cleaning apparatus 10 fits the rim of the substrate S in fitting grooves formed at the outer peripheral portions of rollers 11a provided at the top portions of the spindles 11, and presses the substrate S inward, so that the rollers 11a are rotated (or rotate). In this manner, the substrate S is horizontally rotated. In this example, two of the four rollers 11a give a rotative force to the substrate S, and the other two rollers 11a serve as bearings subject to the rotation of the substrate S. Alternatively, all the rollers 11a may be connected to a drive mechanism, to give a rotative force to the substrate S.

Where the substrate S is being horizontally rotated in this manner, a rinse solution is supplied from the cleaning solution supply nozzle 14 to the surface of the substrate S, and a chemical cleaning solution is supplied from the cleaning solution supply nozzle 15 to the surface of the substrate S. Meanwhile, the upper substrate cleaning roll 12 is moved downward by a vertical drive mechanism not shown in the drawing while being rotated, and is thus brought into contact with the surface of the substrate S that is rotating. The lower substrate cleaning roll 13 is moved upward by a vertical drive mechanism not shown in the drawing while being rotated, and is thus brought into contact with the back surface of the substrate S that is rotating. In this manner, the surface of the substrate S is scrubbed with the upper substrate cleaning roll 12 in the existence of cleaning solutions (the rinse solution and the chemical cleaning solution). The respective vertical drive mechanisms of the upper substrate cleaning roll 12 and the lower substrate cleaning roll 13 may move the upper substrate cleaning roll 12 and the lower substrate cleaning roll 13 up and down in directions perpendicular to the surfaces of the substrate S, may move the upper substrate cleaning roll 12 and the lower substrate cleaning roll 13 up and down in directions oblique to the surfaces of the substrate S, may cause the upper substrate cleaning roll 12 and the lower substrate cleaning roll 13 to pivot around a certain point, or may perform a combination of these operations.

The upper substrate cleaning roll 12 and the lower substrate cleaning roll 13 each have a slightly longer length than the diameter of the substrate S. The upper substrate cleaning roll 12 and the lower substrate cleaning roll 13 are disposed so that the central axes (rotational axes) $O_1$ and $O_2$ thereof are substantially perpendicular to the central axis (which is the rotation center) $O_s$ of the substrate S (or are parallel to the surfaces of the substrate S), and extend along the entire diameter of the substrate S. Thus, the entire front and back surfaces of the substrate S are simultaneously cleaned. In the substrate cleaning apparatus 10 of this embodiment, the upper substrate cleaning roll 12 and the lower substrate cleaning roll 13 are parallel to each other, with the substrate S being interposed in between. However, the upper substrate cleaning roll 12 and the lower substrate cleaning roll 13 may be disposed parallel to the surfaces of the substrate S, and be at a predetermined angle to each other.

It should be noted that the substrate cleaning apparatus 10 may be designed to clean a substrate S of 450 mm in diameter, may be designed to clean a substrate S of 300 mm in diameter, or may be designed to clean a substrate S having a smaller diameter than the above. However, the upper substrate cleaning roll 12 and the lower substrate cleaning roll 13 have substantially the same length as the diameter of the substrate S to be cleaned by the substrate cleaning apparatus 10.

Figure 2:
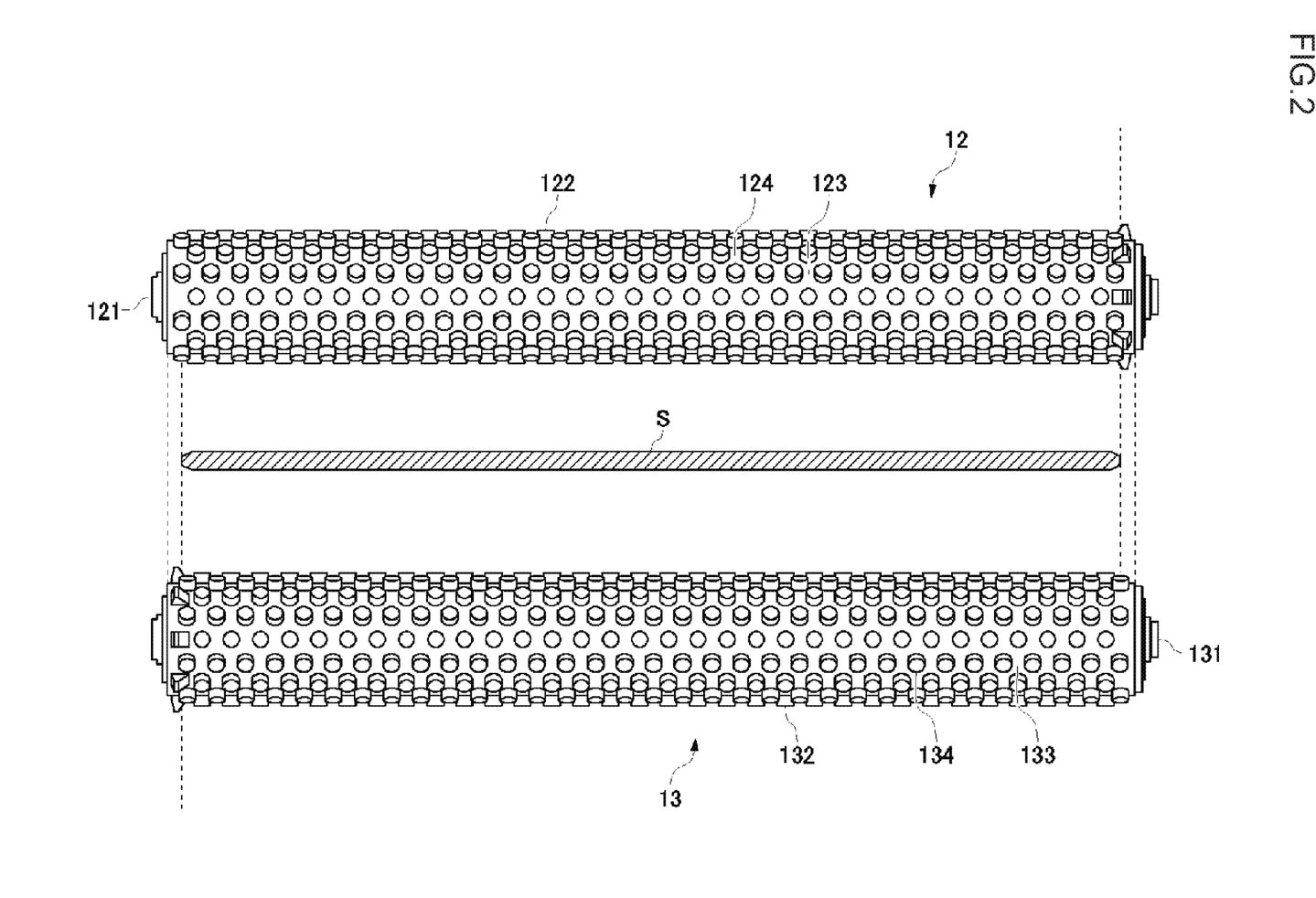
FIG. 2 is a side view of an upper substrate cleaning roll and a lower substrate cleaning roll of the substrate cleaning apparatus, and a substrate in the embodiment of the present technology.

FIG. 2 is a side view of the upper substrate cleaning roll 12 and the lower substrate cleaning roll 13 of the substrate cleaning apparatus 10, and a substrate S. The upper substrate cleaning roll 12 and the lower substrate cleaning roll 13 (hereinafter collectively referred to simply as the "substrate cleaning rolls") are formed with cylindrical cores 121 and 131, and tube-like scrubbing members 122 and 132 secured to the outer peripheral surfaces of the cores 121 and 131. The scrubbing members 122 and 132 are porous components formed with sponge, PVA, or the like. The scrubbing members 122 and 132 have such shapes that nodules 124 and 134 protrude from base surfaces 123 and 133 that are cylindrical surfaces.

The nodules 124 and 134 are aligned along straight lines parallel to the directions of the rotational axes (longitudinal directions) a of the substrate cleaning rolls. These straight lines are equally spaced in circumferential directions of the substrate cleaning rolls. Each two nodules 124 or 134 adjacent to each other in a circumferential direction are out of alignment in the direction of the rotational axis by half a pitch relative to each other. Accordingly, the nodules 124 and 134 are equiangularly spaced in circumferential directions. It should be noted that the above arrangement of the nodules is merely an example, and some other arrangement may be employed.

Nodules 124 and 134 and edge nodules 125 and 135 as bevel cleaners are alternately formed in circumferential directions at one end (the right-side end in FIG. 2) of the scrubbing member 122 of the upper substrate cleaning roll 12 and at one end (the left-side end in FIG. 2) of the scrubbing member 132 of the lower substrate cleaning roll 13. In this embodiment, the edge nodules 125 and 135 are also formed on the straight lines on which the nodules 124 and 134 are formed, and surround the end portions of the scrubbing members 122 and 132. However, the edge nodules 125 and 135 may be disposed in any positions at any appropriate intervals in circumferential directions. Further, although the edge nodules 125 and 135 and the nodules 124 and 134 are alternately formed in this embodiment, one edge nodule 125 or 135 may be formed for every two or more nodules 124 or 134, or conversely, one nodule 124 or 134 may be formed for every two or more edge nodules 125 or 135.

Also, the outermost nodules 124 and 134 located between the edge nodules 125 and 135 are formed in such positions that the surfaces thereof are in contact with the edge of the flat portion of the upper surface (the boundary between the upper surface of the bevel portion) of the substrate S and the edge of the flat portion of the lower surface (the boundary between the lower surface of the bevel portion) of the substrate S. The edge nodules 125 and 135 are also formed in such positions that the later-described substrate-side sloping surfaces 1351 are in contact with the edge of the flat portion of the upper surface (the boundary between the upper surface and the bevel portion) of the substrate S and the edge of the flat portion of the lower surface (the boundary between the lower surface and the bevel portion) of the substrate S.

Figure 3A:
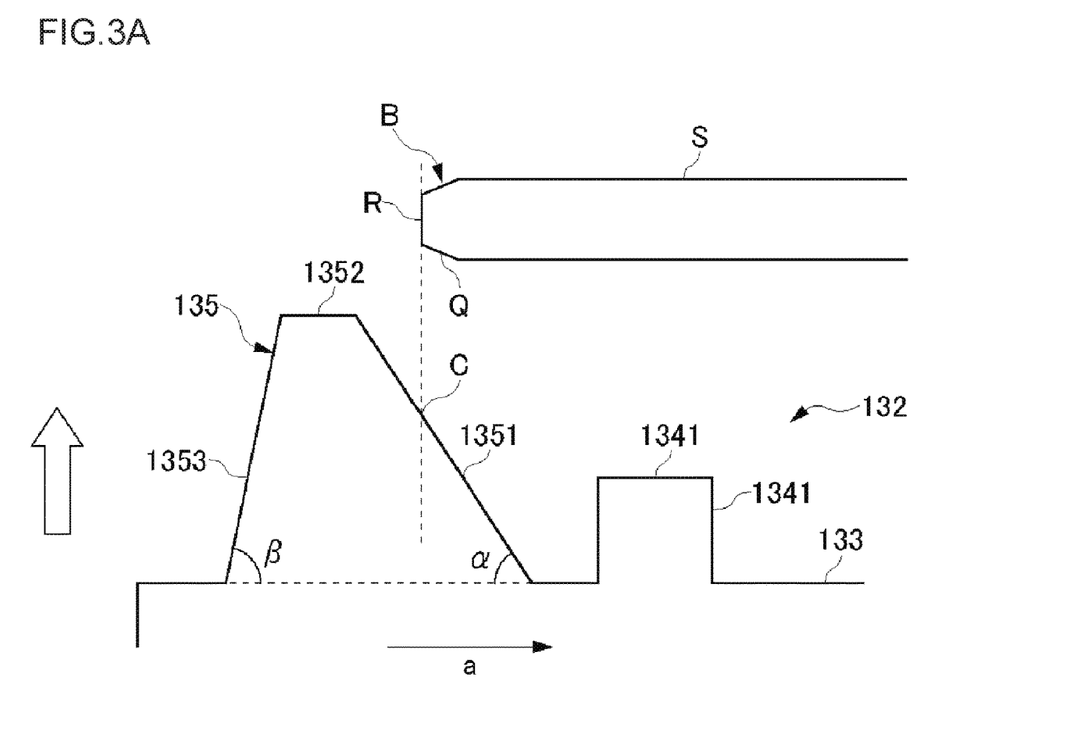
FIG. 3A is an enlarged cross-sectional view of part of a scrubbing member of the lower substrate cleaning roll (in a retracted state) in the embodiment of the present technology.
Figure 3B:
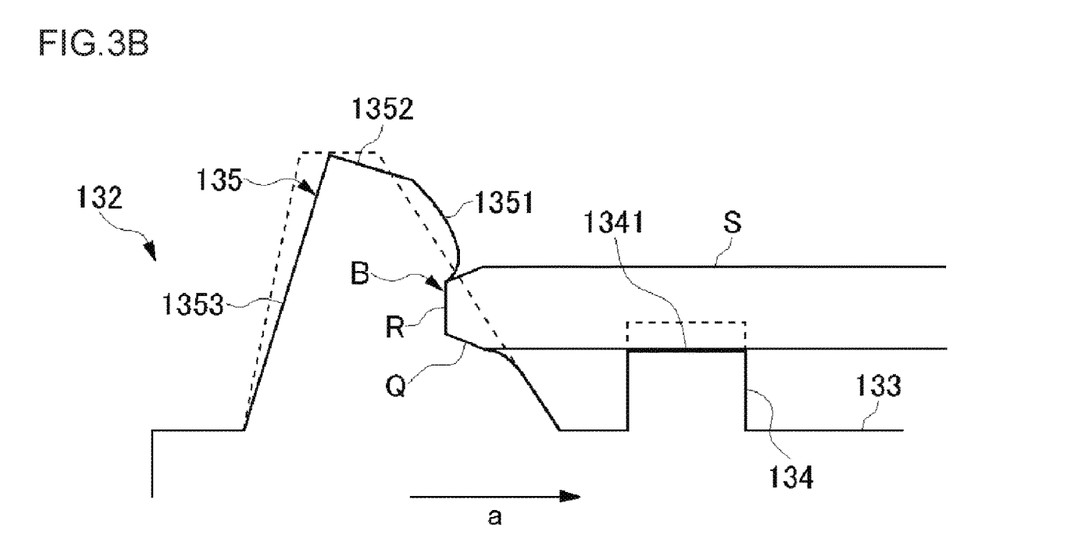
FIG. 3B is an enlarged cross-sectional view of part of the scrubbing member of the lower substrate cleaning roll (in a cleaning state) in the embodiment of the present technology.

FIGS. 3A and 3B are enlarged cross-sectional views of the one end (the left-side end in FIG. 2) of the scrubbing member 132 of the lower substrate cleaning roll 13, taken along a virtual plane that includes the rotational axis of the lower substrate cleaning roll 13. It should be noted that the one end (the right-side end in FIG. 2) of the upper substrate cleaning roll 12 is rotationally symmetrical to the structure shown in FIGS. 3A and 3B, and therefore, explanation of the lower substrate cleaning roll 13 with reference to FIGS. 3A and 3B also serves as explanation of the upper substrate cleaning roll 12.

FIG. 3A illustrates a retracted state in which the substrate S is not in contact with the lower substrate cleaning roll 13. FIG. 3B illustrates a cleaning state in which the substrate S is in contact with the lower substrate cleaning roll 13. In FIGS. 3A and 3B, the substrate S is supported by the rollers 11a (see FIG. 1). It should be noted that FIGS. 3A and 3B illustrate an example where the substrate S is of a straight type. The lower substrate cleaning roll 13 is moved up from the position shown in FIG. 3A by a vertical drive mechanism, and comes into contact with the substrate S as shown in FIG. 3B. In FIGS. 3A and 3B, an arrow a indicates the longitudinal direction (the direction of the rotational axis) of the lower substrate cleaning roll 13.

As shown in FIG. 3A, an edge nodule 135 has a trapezoidal cross-section in the virtual plane that includes the rotational axes of the lower substrate cleaning roll 13. That is, the edge nodule 135 is formed with a substrate-side sloping surface 1351, a top surface 1352, and an outside sloping surface 1353. It should be noted that the edge nodule 135 may be triangular in cross-section not having the top surface 1352, or the top surface 1352 may be a curved surface.

The edge nodule 135 has a greater height than that of an nodule 134. The edge nodule 135 is also formed and located in such a position that the substrate-side sloping surface 1351 has a length to cover all the lower sloping portion Q of the bevel portion B of the substrate S in a radial direction of the substrate S (the longitudinal direction a of the lower substrate cleaning roll 13). Because of this, when the substrate S comes into contact with the scrubbing member 132 of the lower substrate cleaning roll 13, the side portion R as the outermost edge of the substrate S comes into contact with the substrate-side sloping surface 1351 of the edge nodule 135. A first contact site C of the edge nodule 135 at which the lower substrate cleaning roll 13 first comes into contact with the substrate S when moved up and brought into contact with the substrate S is formed on the substrate-side sloping surface 1351 and is located higher than the top surface 1341 of the nodule 134.

As shown in FIG. 3A, both the angle α between the substrate-side sloping surface 1351 and the base surface 133, and the angle β between the outside sloping surface 1353 and the base surface 133 are acute angles. Also, α and β are in the relationship α<β. That is, the slope of the substrate-side sloping surface 1351 is gentler than the slope of the outside sloping surface 1353.

At a time of cleaning, the lower substrate cleaning roll 13 is moved up by a vertical drive mechanism of the substrate cleaning apparatus 10. As shown in FIG. 3B, after the top surface 1341 of the nodule 134 comes into contact with a surface of the substrate S, the lower substrate cleaning roll 13 is moved up until the nodule 134 is pushed down by the substrate S. Consequently, after the edge nodule 135 comes into contact with the bevel portion B of the substrate S at the first contact site C of the substrate-side sloping surface 1351, the edge nodule 135 is deformed by the further rise of the lower substrate cleaning roll 13.

As shown in FIG. 3B, in the cleaning state, the nodule 134 is pushed down by the surface of the substrate S, and the substrate-side sloping surface 1351 of the edge nodule 135 is pushed downward by the bevel portion B of the substrate S. Because of this, the top surface 1352 and the outside sloping surface 1353 of the edge nodule 135 are tilted slightly inward, and the bevel portion B of the substrate S bites into the substrate-side sloping surface 1351. Accordingly, the substrate-side sloping surface 1351 comes into contact with the entire lower sloping portion Q and the entire side portion R as the outermost edge of the substrate S. That is, the edge nodule 135 is deformed so that the substrate-side sloping surface 1351 conforms to the shapes of the lower sloping portion Q and the side portion R of the substrate S. At this point, the substrate-side sloping surface 1351 is in contact with the entire lower sloping portion Q in the radial direction of the substrate S, and is in contact with the entire side portion R in the vertical direction.

The height of the nodule 134 is 3.0 to 4.5 mm, for example, and the decrease in the height of the nodule 134 (the reduction in the height of the nodule 134) pressed by the substrate S in the cleaning state is 0.5 to 2.0 mm, for example. Meanwhile, the height of the edge nodule 135 is 4.0 to 7.0 mm, for example, the slope angle α is preferably 40 to 70 degrees, and the slope angle β is preferably 80 to 90 degrees. It should be noted that the design of the scrubbing member 132 is not limited to the above.

The scrubbing member 132 is a porous component as described above, but a relatively solid layer called a skin layer is normally formed on the surface of the scrubbing member 132. However, the edge nodule 135 of this embodiment has this skin layer removed at least from the substrate-side sloping surface 1351, which is the surface to be in contact with the substrate S. Accordingly, such deformation as to enclose the bevel portion B of the substrate S as shown in FIG. 3B is easily realized.

Although FIG. 3B shows an example where the pushed edge nodule 135 is in contact with the lower bevel portion Q, the side portion R, and part of the upper bevel portion P, the edge nodule 135 may be designed so that the edge nodule 135 pushed down by the bevel portion B comes into contact with the entire bevel portion B including the upper bevel portion P.

Although the edge nodule 135 of the lower substrate cleaning roll 13 has been described so far, similar edge nodules 125 are also formed at one end of the upper substrate cleaning roll 12 as described above. When the upper substrate cleaning roll 12 is moved down toward the substrate S by a vertical drive mechanism, each edge nodule 125 is pushed down by the bevel portion B of the substrate S, and comes into contact with the upper sloping portion P and the side portion R of the bevel portion B in an enclosing manner. At this point, the substrate-side sloping surface of the edge nodule 125 is in contact with the entire upper sloping portion P in the radial direction of the substrate S, and is in contact with the entire side portion R in the vertical direction.

At a time of cleaning, the upper substrate cleaning roll 12 is retracted upward by the vertical drive mechanism, and the lower substrate cleaning roll 13 is retracted downward by the vertical drive mechanism. In this retracted state (a cleaning preparation state), the substrate S is supported by the rollers 11*a* of the spindles 11, and the spindles 11 are rotatively driven, to cause the substrate S to horizontally rotate about its center. Also, cleaning solutions are supplied to the surfaces of the substrate S from the respective cleaning solution supply nozzles 14 and 15. Further, the upper substrate cleaning roll 12 is rotatively driven about the rotational axis in its longitudinal direction by a rotative drive mechanism, and the lower substrate cleaning roll 12 is rotatively driven about the rotational axis in its longitudinal direction by a rotative drive mechanism.

After the cleaning preparation is completed as above, the rotating upper substrate cleaning roll 12 is moved down toward the substrate S by the vertical drive mechanism until the nodules 124 are pushed down by the substrate S, so that the bevel portion B of the substrate S bites into the substrate-side sloping surface of each edge nodule 125. The rotating lower substrate cleaning roll 13 is moved up toward the substrate S by the vertical drive mechanism until the nodules 134 are pushed down by the substrate S, so that the bevel portion B of the substrate S bites into the substrate-side sloping surface 1351 of each edge nodule 135. With this, not only the surface of the substrate S but also the bevel portion B of the substrate S can be cleaned with the substrate cleaning rolls.

As shown in FIG. 2, the upper substrate cleaning roll 12 and the lower substrate cleaning roll 13 are parallel to each other in the longitudinal direction, and the edge nodules 125 and 135 are provided on the opposite sides from each other. Accordingly, in a cleaning state, the edge nodules 125 of the upper substrate cleaning roll 12 and the edge nodules 135 of the lower substrate cleaning roll 13 do not interfere (come into contact) with each other.

In a case where the edge nodules 125 and 135 are provided only at one end of the upper substrate cleaning roll 12 and the lower substrate cleaning roll 13, the edge nodules 125 and 135 may be provided on the following side (the left front side in FIG. 1) that matches the direction in which the portions of the scrubbing members 122 and 132 to be in contact with the substrate S are moved by the rotation of the upper substrate cleaning roll 12 and the lower substrate cleaning roll 13, and the direction in which the surface portions of the substrate S to be in contact with the portions of the scrubbing members 122 and 132 are moved by the rotation of the substrate S. Alternatively, the edge nodules 125 and 135 may be provided on the counter side (the right rear side in FIG. 1).

It should be noted that, in the above embodiment, the edge nodules 125 of the upper substrate cleaning roll 12 come into contact with the entire side portion R in the vertical direction, and the edge nodules 135 of the lower substrate cleaning roll 13 come into contact with the entire side portion R in the vertical direction. Accordingly, the entire surface of the side portion R comes into contact with and is scrubbed by the edge nodules 125 and the edge nodules 135.

In a case where both the upper substrate cleaning roll 12 and the lower substrate cleaning roll 13 have edge nodules, the edge nodules 125 and 135 do not need to come into contact with the entire side portion R in the vertical direction. Instead, the entire bevel portion B can be cleaned, as long as desired spots on the bevel portion B are scrubbed by at least either the edge nodules 125 or the edge nodules 135. In a case where the edge nodules 125 and the edge nodules 135 have the same shapes, the entire bevel portion B can be cleaned, as long as the edge nodules 125 are in contact with at least the portion between the upper portion and the center of the substrate S in the thickness direction (the upper sloping portion P and the upper half of the side portion R), and the edge nodules 135 are in contact with at least the portion between the lower portion and the center of the substrate S in the thickness direction (the lower sloping portion Q and the lower half of the side portion R).

In a case where the bevel portion B of the substrate S is of the round type shown in FIG. 4A, the entire bevel portion B can be cleaned by virtue of cooperation between the upper substrate cleaning roll 12 and the lower substrate cleaning roll 13, as long as the edge nodules 125 enclose at least the upper portion of the bevel portion B located higher than the outermost edge T, and the edge nodules 135 enclose at least the lower portion of the bevel portion B located lower than the outermost edge T.

It should be noted that the substrate cleaning apparatus 10 may further include a conventional side roller (see FIG. 5), in addition to the upper substrate cleaning roll 12 and the lower substrate cleaning roll 13 having the above described structure. With this, the outermost edge of the bevel portion B and the portion near the outermost edge are more meticulously cleaned. Also, in the above embodiment, the substrate cleaning apparatus 10 has a pair of substrate cleaning rolls located above and below a substrate S. However, only either the upper substrate cleaning roll 12 or the lower substrate cleaning roll 13 may be provided. Further, in the above embodiment, the edge nodules 125 and 135 are formed only at one end of the upper substrate cleaning roll 12 and the lower substrate cleaning roll 13. However, edge nodules may be formed at both ends of each substrate cleaning roll. Also, in the above embodiment, the upper substrate cleaning roll 12 and the lower substrate cleaning roll 13 are located parallel to each other and are provided on the front side and the back side of a substrate S, and the edge nodules 125 of the upper substrate cleaning roll 12 and the edge nodules 135 of the lower substrate cleaning roll 13 are formed on the opposite sides from each other. However, the edge nodules 125 of the upper substrate cleaning roll 12 and the edge nodules 135 of the lower substrate cleaning roll 13 may be formed on the same side.

Also, in the above embodiment, multiple edge nodules 125 and 135 are formed on the entire circumferences of the substrate cleaning rolls. However, these edge nodules may be integrally formed on the entire circumferences. In this case, the portions of the scrubbing member 122 and the scrubbing member 132 that bite into the bevel portion B of the substrate S serve as the bevel cleaners. The cross-sectional shape of the bevel cleaners may be the same as that shown in FIGS. 3A and 3B.

A preferred embodiment of the present technology that is conceivable at present has been described so far. However, various modifications may be made to this embodiment, and the claims should be construed as including all such modifications within the true spirit and scope of the present technology.

INDUSTRIAL APPLICABILITY

The present technology has an effect to clean the outermost edge of the bevel portion at the rim of a substrate with bevel cleaners of substrate cleaning rolls, and may be effectively applied to substrate cleaning rolls for scrubbing substrate surfaces, substrate cleaning apparatuses that clean substrates with the substrate cleaning rolls, and the like.

REFERENCE SIGNS LIST

10 Substrate cleaning apparatus
11 Spindle (substrate holding member)
12 Upper substrate cleaning roll
13 Lower substrate cleaning roll
122, 132 Scrubbing member
124, 134 Nodule
125, 135 Edge nodule (bevel cleaner)

The invention claimed is:

1. A substrate cleaning apparatus comprising:
   a substrate holding member configured to hold a substrate;
   at least one substrate cleaning roll;
   a substrate cleaning roll holding member configured to hold the at least one substrate cleaning roll, the at least one substrate cleaning roll having a cylindrical shape, the at least one substrate cleaning roll comprising:
      a plurality of first nodules on a surface of the cylindrical shape; and
      an edge nodule at an outermost position of the cylindrical shape, the edge nodule comprising a first sloping surface,
   wherein a height of the edge nodule is 4 mm to 7 mm and a height of each of the plurality of first nodules is 3 mm to 4.5 mm, and a difference of the height of the edge nodule and the height of each of the plurality of first nodules is at least 1 mm; and
   wherein a cross-section of the edge nodule is a trapezoidal shape and a top surface of the trapezoidal shape is parallel to the surface of the cylindrical shape.

2. The substrate cleaning apparatus according to claim 1, wherein:
   a bevel portion at a rim of the substrate comprises two sloping portions and a side portion between the two sloping portions; and,
   when a vertical drive mechanism pushes the at least one substrate cleaning roll against the substrate held by the substrate holding member, the first sloping surface is deformed and comes into contact with one of the two sloping portions and the side portion of the substrate.

3. The substrate cleaning apparatus according to claim 1, wherein:
   a bevel portion at a rim of the substrate comprises a curved cross-section protruding outward; and,
   when a vertical drive mechanism pushes the at least one substrate cleaning roll against the substrate held by the substrate holding member, the first sloping surface is deformed and comes into contact with a portion between the surface of the substrate and the outermost edge of the bevel portion.

4. The substrate cleaning apparatus according to claim 1, comprising
   two of the at least one substrate cleaning rolls configured to clean two surfaces of the substrate.

5. The substrate cleaning apparatus according to claim 1, further comprising a rotative drive mechanism configured to rotate the at least one substrate cleaning roll about a rotational axis in a longitudinal direction, the at least one substrate cleaning roll being pushed against the surface of the substrate by a vertical drive mechanism.

6. The substrate cleaning member according to claim 1, wherein at least one of the plurality of first nodules is positioned at a position to be in contact with a center of the surface of substrate.

* * * * *